(12) United States Patent
Yu-Chou

(10) Patent No.: US 6,979,242 B2
(45) Date of Patent: Dec. 27, 2005

(54) MANUFACTURING METHOD AND STRUCTURE OF COPPER LINES FOR A LIQUID CRYSTAL PANEL

(75) Inventor: Lee Yu-Chou, Taipei (TW)

(73) Assignee: Chungwha Picture Tubes, Ltd., Taipei (TW)

( * ) Notice: Subject to any disclaimer, the term of this patent is extended or adjusted under 35 U.S.C. 154(b) by 209 days.

(21) Appl. No.: 10/449,366

(22) Filed: May 29, 2003

(65) Prior Publication Data

US 2004/0242112 A1   Dec. 2, 2004

(51) Int. Cl.[7] .................................................. H01J 9/40
(52) U.S. Cl. ........................................................ 445/23
(58) Field of Search ..................... 445/23–25

(56) References Cited

U.S. PATENT DOCUMENTS 6,468,873 B1 * 10/2002  Liu et al. ..................... 438/387

* cited by examiner

Primary Examiner—Joseph L. Williams
(74) Attorney, Agent, or Firm—Perkins Coie LLP

(57) ABSTRACT

In those conventional arts, for large-size LCD, the process of copper damascene interconnect has some problems of forming a uneven copper seed layer and forming hollows during electrical plating due to the electrical plating area being too large to electroplate uniformly. In this invention, it employs a Cu tape to directly stick on a substrate to replace forming a copper seed layer and electroplating. Hence, the invention avoids the problem of unevenness and hollows in those conventional arts and so the Cu lines can be applied to the large-size LCD.

15 Claims, 4 Drawing Sheets

MANUFACTURING METHOD AND STRUCTURE OF COPPER LINES FOR A LIQUID CRYSTAL PANEL

TECHNICAL FIELD

This invention relates to a manufacturing method and a structure of conducting lines for a liquid crystal panel, and more particularly to a manufacturing method and a structure of Cu lines formed with Cu tape for a liquid crystal panel.

BACKGROUND

The amount of transistors in a liquid crystal display (LCD) is approximate over millions. An arrangement of a liquid crystal is controlled through a corresponding transistor and so brightness of each pixel corresponding the transistor is simultaneously determined to display an image. Each transistor connects two conducting lines of a gate line and a data line. The gate line controls a switch of the transistor to make the transistor turn on at a certain time for receiving the image data. At the certain time, the data line delivers data to the transistor. These electrical features of the conducting line and the related line effect a resolution and a response time of the LCD.

Recently, the developing tendency of the LCD tends to become faster in the response time and larger in the size. In general, a large-size (e.g.: larger than 20 inches for TFT-LCD) LCD employs aluminum (Al) as the base material of the conducting line due to the cost of Al is low and the electrical conductivity of Al is good. Mainly, the conducting line of the LCD is made of a single layer of Al, a double layers of Al and another metal, or Al alloy and another metal.

The electrical conductivity of the Al conducting line can't break through the bottleneck of the electrical conductivity in those conventional arts regarding the demand for a larger size LCD with higher resolution and faster response time (especially for LCD-TV). It must find new material to satisfy the demand for higher resolution and faster response time.

Recently, in the semiconductor industry, the Al conducting line is replaced with copper (Cu) having better electrical conductivity for solving the problem of the electrical conductivity. However, no appropriate etching solution for Cu and so to form Cu line is very hard. The damascene process is illustrated as below. First, a hole 20 is formed on a substrate 10 and then a thin and continuous copper seed layer 30 is formed on a surface of the substrate 10, as shown in FIG. 2A. The copper seed layer 30 can raise an adhesive force between the Cu line and the substrate, and benefit a growth of the Cu line in the successive electroplating process. The copper seed layer 30 must simultaneously cover with a surface of the hole 20 and so the copper seed layer 30 can grow along the surface of the hole 20 during the electroplating process. Furthermore, the copper seed layer 30 must be thin, even, and continuous for avoiding to generate some hollows. However, if there is a doubt about a current leakage resulted from the Cu dispersing to other layers, a barrier layer 40 is added for preventing the Cu from diffusing into other layers, as shown in FIG. 2B. The barrier layer also can avoid the Cu reacting with silicon simultaneously. Hence, the barrier layer 40 is formed before the copper seed layer 30 when there is the aforementioned doubt.

The electroplating process is then performed to electroplate a Cu electroplating layer 50 on the copper seed layer 30 for making the Cu electroplating layer 50 cover with the copper seed layer 30 continuously, smoothly and fine. The hole 20 will be filled with the Cu electroplating layer 50 and no hollow is produced, as shown in FIG. 3 (the barrier layer not being shown). Finally, a chemical mechanical polishing (CMP) is performed to polish the copper seed layer 30 until the surface of the substrate 10 and only the portion of the copper seed layer 30 inside of the hole 20 is remained, as shown in FIG. 4. Hence, the forming of the Cu conducting line is finished.

However, the aforementioned process of the Cu conducting line can not be apply to the TFT-LCD. The main reason is that the area of the liquid crystal panel is quite large compared with the 12 inches wafer in semiconductor industry. Therefore, for the forming of the copper seed layer 30, the thickness of the copper seed layer 30 is hard to control within a certain range and so some hollows are easily produced therein. Furthermore, the electroplating rate of the Cu electroplating layer must be controlled more accurately for the electroplating rate being almost equal in every position. But, the difficulties of these problems will increase with the size of the LCD. Hence, for a large-size liquid crystal panel, the problems is hard to overcome.

SUMMARY

In those conventional arts, the process of the Cu conducting line is hard to implement in a large area. One of the objectives of the present invention is to provide a novel process of the Cu conducting line for avoiding forming an uneven Cu seed layer in a large area.

Another objective of present invention is to employ the manufacturing method of Cu line for forming even Cu lines on a large area.

Another objective of present invention is to employ a Cu tape to directly stick on a substrate to replace the process of Cu line in the conventional arts for reducing the processes and cost.

Another objective of present invention is to efficiently avoid forming hollows and defects in Cu lines by employing a Cu tape, and to form even Cu lines.

Another objective of present invention is to replace Al lines with Cu lines for reducing the RC delay time in the LCD.

As aforementioned, the present invention provides a structure of Cu line in a liquid crystal panel. The structure has a substrate and a plurality Cu lines, wherein the substrate has a plurality trenches on a surface of the substrate and the plurality Cu lines is formed by sticking a Cu tape on the surface of the substrate and a chemical mechanical polishing is performed to entirely remove a portion of the Cu tape outside of the plurality of trenches.

Moreover, the present invention provides a manufacturing method of Cu line in a liquid crystal panel. The manufacturing method comprises: forming a plurality trenches on a substrate; sticking a Cu tape on the substrate and the plurality of trenches; and performing a chemical mechanical polishing to remove a portion of the Cu tape outside of the plurality of trenches.

Due to the difference thickness' of the Cu tape in different parts being slight and hollows and defects in the Cu lines being easily controlled to avoid compared with the conventional arts, the present invention can avoid the problems of unevenness, hollows, etc. Moreover, the steps of process of the present invention is less than of the conventional arts and so both the process time and the cost thereof are reduced efficiently. A different structure or layer also can formed between the substrate and the Cu tape for enhancing a adhesive force of Cu and avoiding a Cu diffusion. Furthermore, to replace Al line with Cu line can reduce the RC delay time in LCD and not limit a resolution and a response time of a large-size LCD resulted from a bottleneck of a electrical conductivity of the Al.

DETAILED DESCRIPTION

Some sample embodiments of the invention will now be described in greater detail. Nevertheless, it should be recognized that present invention can be practiced in a wide range of other embodiments besides those explicitly described, and the scope of the present invention is expressly not limited expect as specified in the accompanying claims.

Then, the components of the different elements are not shown to scale. Some dimensions of the related components are exaggerated and meaningless portions are not drawn to provide a more clear description and comprehension of the present invention.

Figure 1:
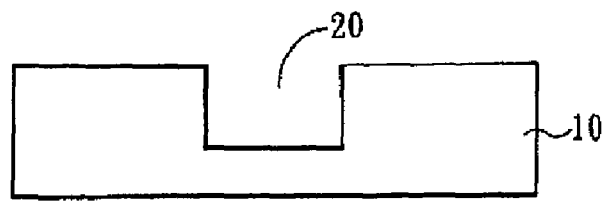
FIG. 1 is a diagram of forming a hole on a substrate in those conventional arts.
Figure 2A:
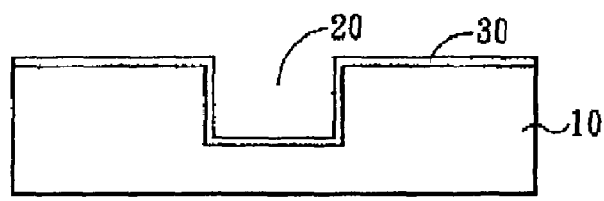
FIG. 2A is a diagram of forming a copper seed layer on the substrate and the hole in those conventional arts.
Figure 2B:
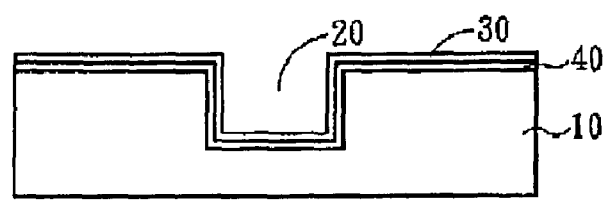
FIG. 2B is a diagram of forming a barrier layer and a copper seed layer on the substrate and the hole in those conventional arts.
Figure 3:
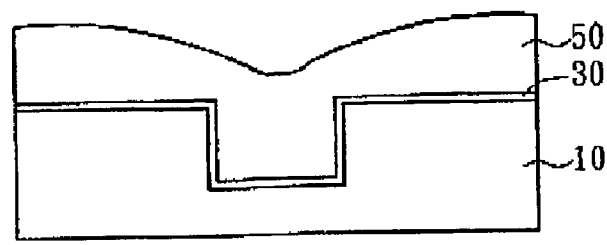
FIG. 3 is a diagram of filling the hole and forming on the surface of the substrate with Cu by electroplating in those conventional arts.
Figure 4:
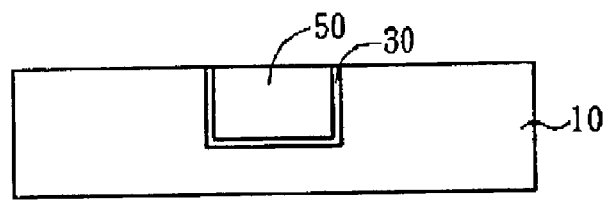
FIG. 4 is a diagram of performing CMP to remove a portion of Cu tape outside of the hole for forming Cu line in those conventional arts.
Figure 5:
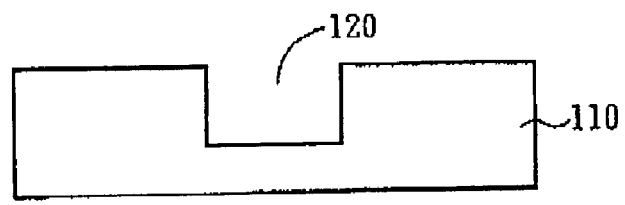
FIG. 5 is a diagram of forming trenches on a substrate in one preferred embodiment of the present invention.

FIG. 5 is a diagram of forming a trench on a substrate in one preferred embodiment of the present invention. First, a plurality of trenches 120 are formed on a substrate 110. The forming steps of trenches 120 comprise: spin coating a photoresist layer on the substrate 110; exposing the photoresist layer with a mask; developing the photoresist layer for removing a portion of the photoresist layer above the areas of trenches 120; the substrate 110 is etched with the photoresist layer as a mask for forming the trenches 120; and removing the photoresist. In general, the substrate 110 is etched with the wet etching. The solution of etchant is preferably NaOH, HF, or the mixing solution of HF and $NH_4F$.

Figure 6:
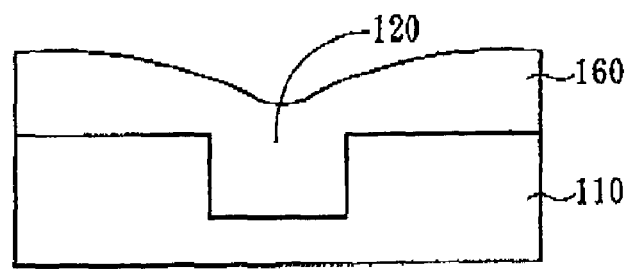
FIG. 6 is a diagram of sticking a Cu tape on the substrate and the trenches in one preferred embodiment of the present invention.

Referring to FIG. 6, a Cu tape (or a Cu slice) is struck on the trenches 120 and fill the trenches 120 without hollows and defects. For ensuring that the Cu tape can entirely and easily fill the trench120 and closely spread on the substrate 110, the Cu tape 160 is struck with high temperature, high pressure, or high temperature and high pressure to enhance an adhesive force between the Cu tape 160 and the trenches 120.

Figure 7:
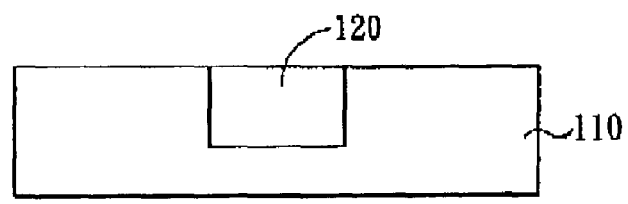
FIG. 7 is a diagram of performing CMP to remove a portion of Cu tape outside of the trenches for forming Cu line in one preferred embodiment of the present invention.

Finally, the Cu tape is polished with chemical mechanical polishing until a surface of the substrate 110 for removing the portion of Cu tape outside of the trenches 120. As shown in FIG. 7, the portion of the Cu tape filling with the trenches 120 is the Cu lines.

A substrate made of any material is suitable for the present invention, especially a large-size LCD. Moreover, the Cu lines also can formed on another structure, not be limited to the glass substrate of the LCD. For example, the Cu line is also formed on a SiN layer. The $SiN_x$ has a feature of lower melting point and so is suitable for the LCD employed glass as a substrate.

Figure 8:
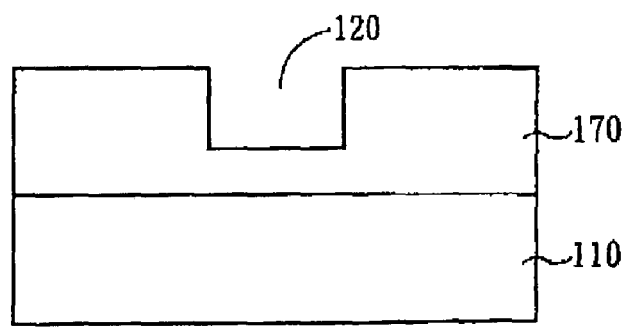
FIG. 8 is a diagram of forming a $SiN_x$ layer on the substrate and then forming trenches on the $SiN_x$ layer in another preferred embodiment of the present invention.

Another embodiment of the present invention is as shown in FIG. 8. First, a $SiN_x$ layer 170 is formed on a substrate 110 and then a plurality of trenches 120 are formed on the $SiN_x$ layer 170. The forming steps of trenches 120 comprise: spin coating a photoresist layer on the substrate 110; exposing the photoresist layer with a mask; developing the photoresist layer for removing a portion of the photoresist layer above the area of trenches 120; the $SiN_x$ layer 170 is etched with the photoresist layer as a mask for forming the trenches 120; and removing the photoresist layer. In general, the $SiN_x$ layer 170 is etched with wet etching.

Figure 9:
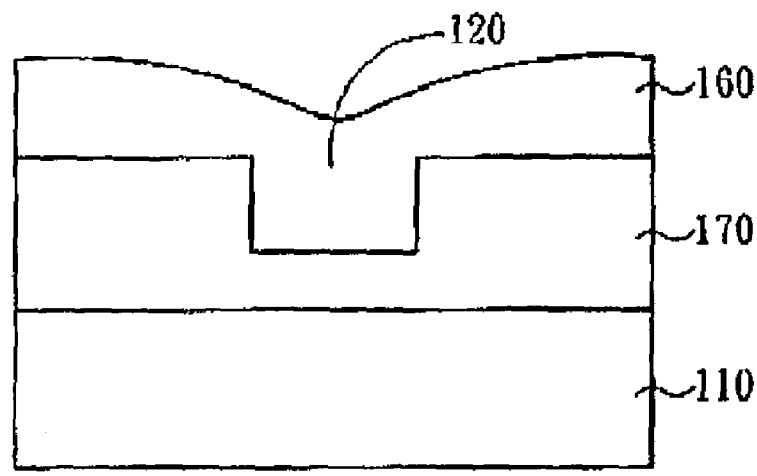
FIG. 9 is a diagram of sticking a Cu tape on the substrate and the trenches in another preferred embodiment of the present invention.

Referring to FIG. 9, a Cu tape is struck on the trenches 120 and fill the trenches 120 without hollows and defects. For ensuring that the Cu tape can entirely and easily fill the trench120 and closely spread on the $SiN_x$ layer 170, the Cu tape 160 is struck with high temperature, high pressure, or high temperature and high pressure to enhance an adhesive force between the Cu tape 160 and the trenches 120.

Figure 10:
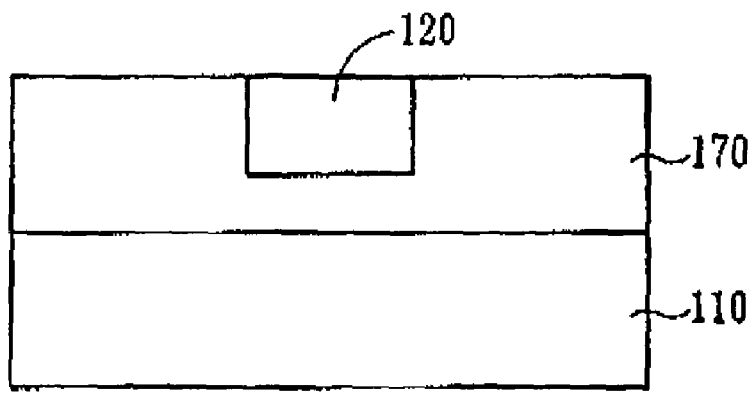
FIG. 10 is a diagram of performing CMP to remove a portion of Cu tape outside of the trenches for forming Cu lines in another preferred embodiment of the present invention.

Finally, the Cu tape is polished with chemical mechanical polishing until a surface of the $SiN_x$ layer 170 for removing the portion of Cu tape outside of the trenches 120. As shown in FIG. 10, the portion of the Cu tape filling with the trenches 120 is the Cu lines.

If an adhesive force between the Cu tape 160 is not good enough or the Cu through diffusive action enters into other structures and results in some problems such as a current leakage, a buffer layer must be formed between the Cu tape 160 and the substrate 110 for enhancing the adhesive force or avoiding the diffusive action of the Cu. The method of adding the buffer layer is: first, forming a buffer layer on the trenches and the substrate, and then sticking the Cu tape on the buffer layer. Therefore, for any embodiments, it can add a buffer layer with the aforementioned method. The demand for a feature of the buffer layer must be that adhesive force between the buffer layer, the substrate 110, and the Cu tape 160 is good enough. For blocking the diffusive action of the Cu, another feature of the buffer layer must be further request that the capability of blocking Cu is good enough.

The manufacturing method and the structure of Cu lines for a liquid crystal panel is suitable for the Cu line in a nondisplay region of an edge of the liquid crystal panel in order to avoid shadowing or reflecting a light from a light module of the LCD. The present invention is also suitable for a LCD with chip on glass (COG). The conducting lines of the array in a display region, through an appropriate handling (e.g. a anti-reflective layer is formed on the edge of the conducting lines), also can be formed by employing the present invention.

In accordance with the present invention, the present invention discloses a manufacturing method and a structure of Cu lines for a liquid crystal panel. The present invention employs a method of sticking Cu tape to replace the method of forming a copper seed layer and electroplating in the conventional arts. Due to the thickness of the Cu tape is very even and the problems of hollows and defects are seldom compared with that in the conventional arts, the problems of unevenness, hollow, etc. can be avoided. Moreover, the forming method of the Cu lines in the present invention can decrease the complexity and the cost. Another structure or layer according to different demand for consideration is also easily formed on (or in) the structure of the present invention. To replace Al lines with Cu lines can reduce the RC delay time of the LCD and not limit the resolution and the response time of a large-size LCD resulted from the bottleneck of the electrical conductivity of the Al.

Although specific embodiments have been illustrated and described, it will be obvious to those skilled in the art that various modifications may be made without departing from what is intended to be limited solely by the appended claims.

I claim:

1. A manufacturing method of Cu lines in a liquid crystal panel, comprising:
   forming a plurality of trenches on a substrate;
   sticking a Cu slice on said substrate and said plurality of trenches; and
   performing a chemical mechanical polishing to remove a portion of said Cu slice outside of said plurality of trenches.

2. The manufacturing method according to claim 1, wherein said method further comprises forming a buffer layer between said trenches, said substrate and said Cu slice.

3. The manufacturing method according to claim 1, wherein said substrate is a glass substrate.

4. The manufacturing method according to claim 1, wherein said trenches are formed by etching with a solution of NaOH.

5. The manufacturing method according to claim 1, wherein said trenches are formed by etching with a solution of HF.

6. The manufacturing method according to claim 1, wherein said trenches are formed by etching with a mixing solution of HF and $NH_4F$.

7. The manufacturing method according to claim 1, wherein said trenches are formed in a nondisplay region of an edge of said liquid crystal panel.

8. The manufacturing method according to claim 1, wherein said Cu slice is struck on said substrate with heating.

9. The manufacturing method according to claim 1, wherein said Cu slice is struck on said substrate with pressurizing.

10. A manufacturing method of Cu lines in a liquid crystal panel, comprising:
    forming a $SiN_x$ layer on a substrate;
    forming a plurality of trenches on said $SiN_x$ layer;
    sticking a Cu slice on said $SiN_x$ layer and said plurality of trenches; and
    performing a chemical mechanical polishing to remove a portion of said Cu slice outside of said plurality of trenches.

11. The manufacturing method according to claim 10, wherein said method further comprises forming a buffer layer between said trenches, said $SiN_x$ and said Cu slice.

12. The manufacturing method according to claim 10, wherein said trenches are etched with a wet etching.

13. The manufacturing method according to claim 10, wherein said trenches are formed in a nondisplay region of an edge of said liquid crystal panel.

14. The manufacturing method according to claim 10, wherein said Cu slice is struck on said substrate with heating.

15. The manufacturing method according to claim 10, wherein said Cu slice is struck on said substrate with pressurizing.

* * * * *